United States Patent [19]

Dambach et al.

[11] Patent Number: 4,538,878
[45] Date of Patent: Sep. 3, 1985

[54] SOLDERLESS CIRCUIT BOARD CONNECTOR

[75] Inventors: Philip J. Dambach, Naperville; B. Alan Berg, Huntley, both of Ill.

[73] Assignee: Molex Incorporated, Lisle, Ill.

[21] Appl. No.: 522,947

[22] Filed: Aug. 12, 1983

[51] Int. Cl.³ .............................................. H01R 4/24
[52] U.S. Cl. ............................ 339/217 R; 339/221 R; 29/739; 29/758
[58] Field of Search ....... 339/176 M, 176 MP, 217 R, 339/17 C, 220 R, 221 R, 221 M; 29/739, 747, 758

[56] References Cited

U.S. PATENT DOCUMENTS

| | | | |
|---|---|---|---|
| 2,811,702 | 10/1957 | Narozny | 339/220 R |
| 3,243,761 | 3/1966 | Piorunneck | 339/217 R |
| 3,601,750 | 8/1971 | Mancini | 339/221 R |
| 4,066,326 | 1/1978 | Lovendusky | 339/17 C |
| 4,076,356 | 2/1978 | Tamburro | 339/17 M |
| 4,156,553 | 5/1979 | Ammon et al. | 339/176 M |
| 4,286,837 | 9/1981 | Yasutake et al. | 339/221 R |
| 4,327,954 | 5/1982 | Aldridge et al. | 339/176 MP |
| 4,362,353 | 12/1982 | Cobaugh et al. | 339/258 P |
| 4,400,049 | 8/1983 | Schuck | 339/176 MP |

FOREIGN PATENT DOCUMENTS

| | | | |
|---|---|---|---|
| 1108257 | 9/1981 | Canada | 339/176 MP |
| 1491217 | 11/1977 | United Kingdom | 339/217 R |

Primary Examiner—Gil Weidenfeld
Assistant Examiner—Gary F. Paumen
Attorney, Agent, or Firm—Louis A. Hecht; Bruce R. Mansfield

[57] ABSTRACT

A solderless, generally elongated, circuit board conductor adapted to be received and held in a plated-through hole formed in the circuit board in order to provide an electrical connection between a conductive plating deposited on the interior surface of the hole of another circuit element. The conductor includes a compliant section which is adapted to be received in the hole in contact with the plating and allowing selective insertion and removal of the conductor into and out of the hole. The compliant section generally comprises a plate section with a resilient finger struck out therefrom. The finger has an apex portion to contact the plating of the hole.

Also disclosed is a connector assembly which is selectively mountable on a circuit board and which includes an insulative base portion with a plurality of solderless elongated electrical terminals mounted therein. Each terminal has a lower compliant section of the type described above which is adapted to be received in plated-through holes formed in the board in contact with plating on the interior surface thereof. An insertion tool is provided that simultaneously cooperates with the terminals and base portion for supporting the terminals in the base portion when the assembly is mounted in said board.

3 Claims, 8 Drawing Figures

SOLDERLESS CIRCUIT BOARD CONNECTOR

BACKGROUND OF THE INVENTION

1. Field of the Invention

The present invention relates generally to a solderless electrical circuit conductor, and more particularly, to a conductor of the type having a compliant section adapted for insertion in a plated-through hole in a circuit board.

In addition, the present invention relates to board mountable electrical connector assemblies having the foregoing compliant terminals fitted therein.

2. Description of the Prior Art

Since the advent of semi-conductor technology, printed circuit board arrangements have become increasingly relied upon for providing both structural support and electrical interconnection for circuit devices of various types. Particularly with miniaturization of circuit devices, printed circuit boards have become widely used in diverse machinery and equipment applications. Typical circuit board construction includes a relatively rigid substrate composed of an electrically non-conductive, dielectric material and having a usual thickness on the order of one-eight inch. One or both sides of the board may have an array of electrically conductive circuit paths defined thereon to provide for the interconnection of circuit devices which have been assembled to the board. It is common practice to terminate the circuit paths in an annular configuration, circumscribing apertures formed through the board for receiving individual leads of the circuit devices. The leads are then soldered to the circuitry on the board.

For economy of manufacturer and maintenance, modularization has become a popular concept in the design of electrical and electronic systems. Accordingly, it is expedient in some applications to provide for interconnection means such that individual circuit boards consisting of modular electronic subassemblies may be interconnected in any desired network system. To this end, pin terminals may be utilized as an effective interconnection means for terminating the electrically conductive paths of a printed circuit board by insertion into apertures formed in the board. Known terminals of this type are of diverse configurations. For example, the terminal disclosed in Narozny, U.S. Pat. No. 2,811,702 issued Oct. 29, 1957 is of a type which is staked within a board aperture and then wave soldered to the circuit path.

In another configuration, the board is adapted with eyelets or so called "plated-through" holes to facilitate the electrical connection of the pin terminals and circuit paths of the board. An example of the latter configuration may be found in Mancini, U.S. Pat. No. 3,601,750 issued Aug. 24, 1971. Because of the electrical interface formed when pins are staked within plated through holes, it is usually unnecessary to solder the pins to the board circuitry.

In certain applications, it is desirable to replace pins which have been mounted in plated through holes. Thus, a popular pin terminal configuration is one which includes a compliant section receivable within the hole and having the capability of adjusting the pin to the size of the aperture without impairing the electrical and mechanical relationship between the pin and the plating. Exemplary terminals of this type are disclosed in U.S. Pat. No. 4,076,356 to Tamburro issued Feb. 28, 1978, U.S. Pat. No. 4,066,326 to Lovendusky issued Jan. 3, 1978, and U.S. Pat. No. 4,362,353 to Cobaugh, et al., issued Dec. 7, 1982, all of which are directed to terminal configurations having a compliant section which essentially conforms to the size of the board aperture.

Known terminals having so called compliant sections suffer from a number of disadvantages, particularly where it is desired that the terminal be alternately inserted into and withdrawn from the board aperture over a number of cycles. Many conventional compliant terminal configurations tend to skive out or remove the plating which has been provided in the board aperture, thereby degrading the electrical interface between the terminal and the board. When this occurs to certain proportions, the board can be rendered completely, or practically, useless. The servicing of electrical equipment having circuit boards so affected can involve considerable expense. Other terminal configurations which exhibit improved cyclability characteristics have insufficient ability to withstand retrograde withdrawal forces, and can become dissociated from the circuit board during normal use. There is also a need for a simple, economic means for mass inserting compliant terminals in printed circuit boards where a plurality of connections to the board are desired.

SUMMARY OF THE INVENTION

Accordingly, it is an object of the present invention to provide a pin terminal having a compliant section which is adaptable to varying circuit board aperture sizes.

Another object is to configure the pin terminal such that it advantageously ensures a reliable mechanical and electrical connection to the board.

Yet another object of the present invention is to further provide such a terminal with the additional capability of being alternately inserted into and withdrawn from the circuit board over a multiplicity of insertion and withdrawal cycles without damage to the contact plating of the aperture.

Still another object is to provide an electrical connector assembly which is easily mountable on the printed circuit board and has a plurality of the foregoing compliant terminals arranged therein.

The foregoing and other objects of the invention are realized in an illustrative embodiment of a solderless, generally elongated circuit board pin terminal adapted to be received and held in a hole formed in the circuit board in order to provide an electrical connection between a conductive plating deposited on the interior surface of the hole and another circuit element external to the board. The pin terminal includes a compliant section which is adapted to be received in the hole, in contact with the plating and allowing for selective insertion and withdrawal of a terminal into and out of the hole. The compliant section generally comprises a plate with a resilient finger struck outwardly therefrom. The finger is formed with an apex portion for contacting the plating of the hole. The elements of the compliant section are so dimensioned that the pin terminal is securely positionable within the circuit board aperture under a force fit, however, the electrical interface between the aperture plating and terminal is provided by the biasing force exerted by the resilient finger against the wall of the aperture.

The terminal is further adapted with a land portion extending generally transversely of the longitudinal axis of the terminal providing a surface against which a force may be applied to insert the compliant section into a board aperture. A plurality of the foregoing terminals may be adapted for use in an electrical connector. A connector in accordance with the principles of the invention may be mounted on a circuit board using a simple tool which is attachable to the connector housing and which supports the compliant terminals along the land portions during the insertion process.

BRIEF DESCRIPTION OF THE DRAWINGS

The aforementioned objects and features of the invention, as well as other objects and features, will be better understood upon consideration of the following detailed description and appended claims taken in conjunction with the attached drawings of illustrative embodiments thereof in which:

DESCRIPTION OF THE PREFERRED EMBODIMENTS

Figure 1:
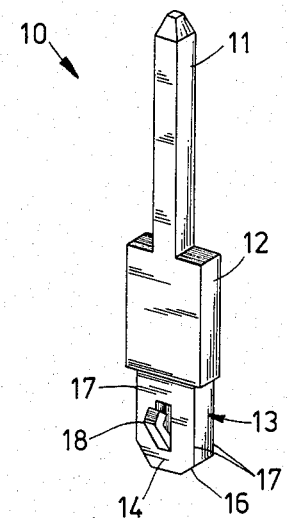
FIG. 1 is a perspective view of a pin conductor in accordance with the present invention.

FIG. 1 illustrates a post-type pin terminal, designated generally by the reference numeral 10. Pin terminal 10 is preferably stamped and formed from sheet metal and comprises an elongated contact portion 11, an intermediate body portion 12, and a compliant section, designated generally by the reference numeral 13. Compliant section 13 comprises a plate 14 formed with a tapered end portion 16 and with edges 17 oriented generally parallel to the longitudinal axis of the terminal 10.

Figure 2:
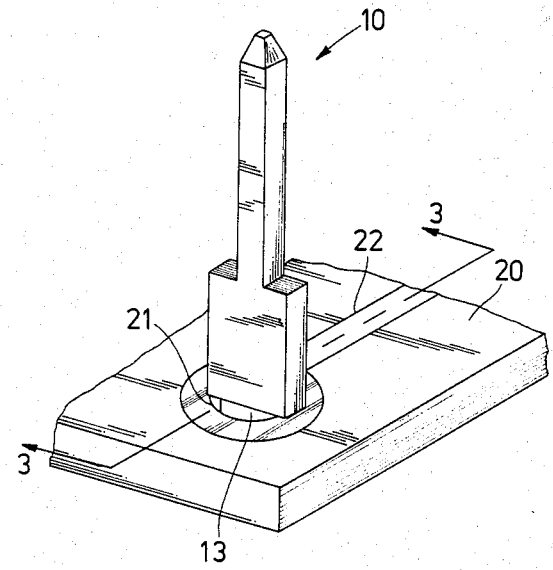
FIG. 2 is a perspective view showing the pin conductor of FIG. 1 as being mounted on a typical printed circuit board.

Turning now to FIG. 2, a pin terminal 10 is mounted in free standing disposition on a printed circuit board, designated generally by the reference numeral 20, which has an aperture 21 for receiving the pin terminal 10 therein. The aperture 21 is positioned centrally of a conducting circuit path 22 to which the pin terminal 10 is intended to be electrically connected. The plate 14 of the terminal 10 is suitably dimensioned so as to be received by the aperture 21 with a force fit, as will be explained in greater detail, hereinafter.

Figure 3:
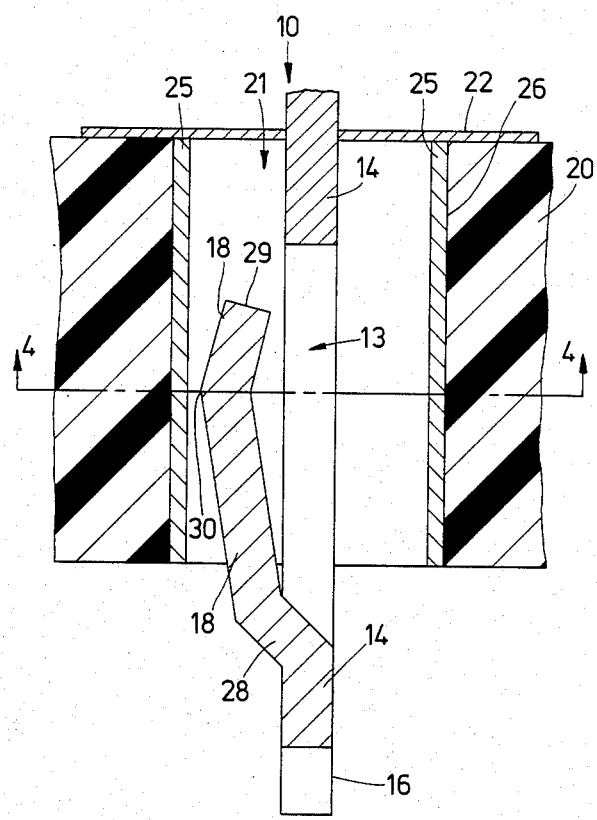
FIG. 3 is an enlarged fragmentary sectional view taken generally along the line 3—3 of FIG. 2.
Figure 4:
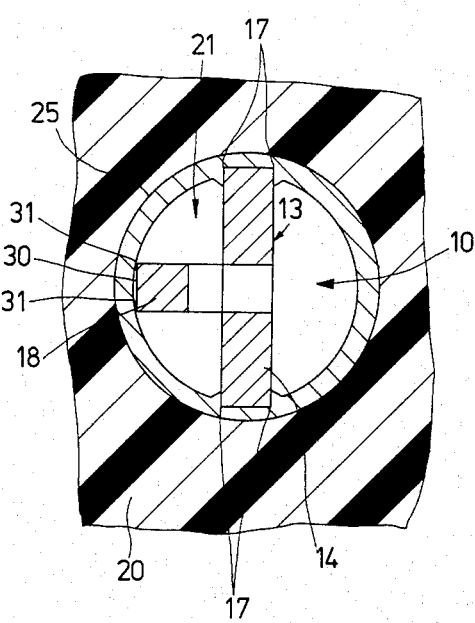
FIG. 4 is a fragmentary sectional view taken generally along the line 4—4 of FIG. 3.

As best shown in FIGS. 3 and 4, electrical contact is made between the pin terminal 10 and plating 25 defined by a layer of electrically conductive material deposited on the interior surface 26 of the aperture 21. Resilient finger 18 is struck from plate 14 at a joined end 28 positioned proximate the tapered portion 16 of the plate 14. Finger 18 has a free end 29 extending along the longitudinal center line of the pin terminal 10 in a direction opposite the direction in which pin terminal 10 is moved during its insertion into an aperture of a printed circuit board. This arrangement of resilient finger 18 and the tapered portion 16 of the plate 14 combine to facilitate insertion of the terminal 10 into the printed circuit board aperture 21 with relative ease. The resilient finger 18 is preferably formed, in cross section, with a radius or shallow V-shape defining an apex, designated generally by the reference numeral 30. The apex 30 is directed generally outwardly of the compliant section. When terminal 10 is inserted in a plated-through aperture 21 of a printed circuit board 20 the apex 30 of the resilient finger 18 makes contact with the plating 25 preferably at two points, designated generally by the reference numeral 31.

The width of plate 14 between diametrically opposed edges 17 is slightly greater than the diameter of aperture 21, and accordingly, deformation of the aperture 21 occurs at the edges 17 of the terminal 10 upon its insertion. Because of this deformation together with natural compliance of the plate 14, the terminal 10 is maintained immovable within its respective aperture 21 and compressive forces generated within the board substrate 20 across the plate 14 prevent withdrawal of the terminal 10 during normal use. If the terminal 10 is forcibly withdrawn, it may be reinserted into its original mounted position without sciving or degrading of the plating 25 in the contact interface formed with the apex portion 30 of the resilient finger 18.

Figure 5:
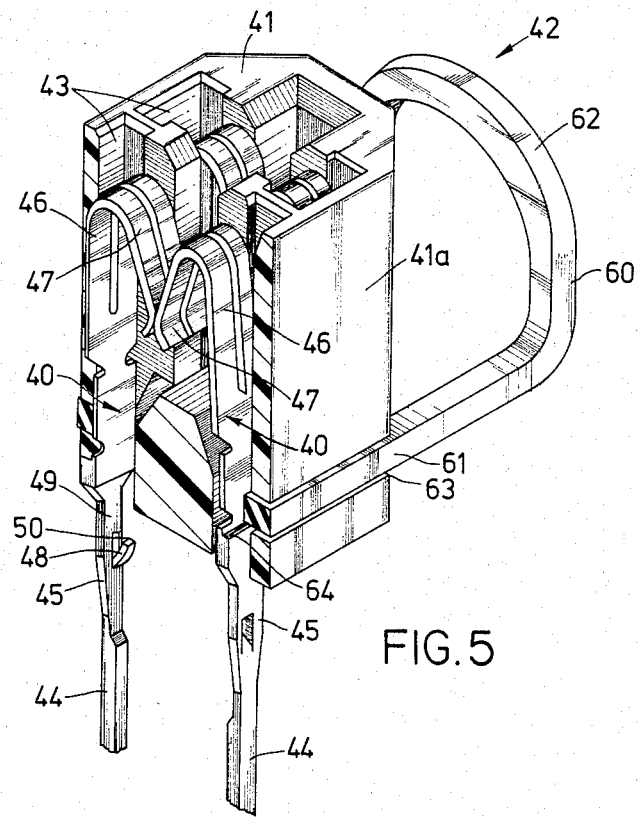
FIG. 5 is a fragmentary sectional perspective view illustrating an electrical connector housing fitted with a plurality of pin terminals constructed in accordance with the present invention.
Figure 6:
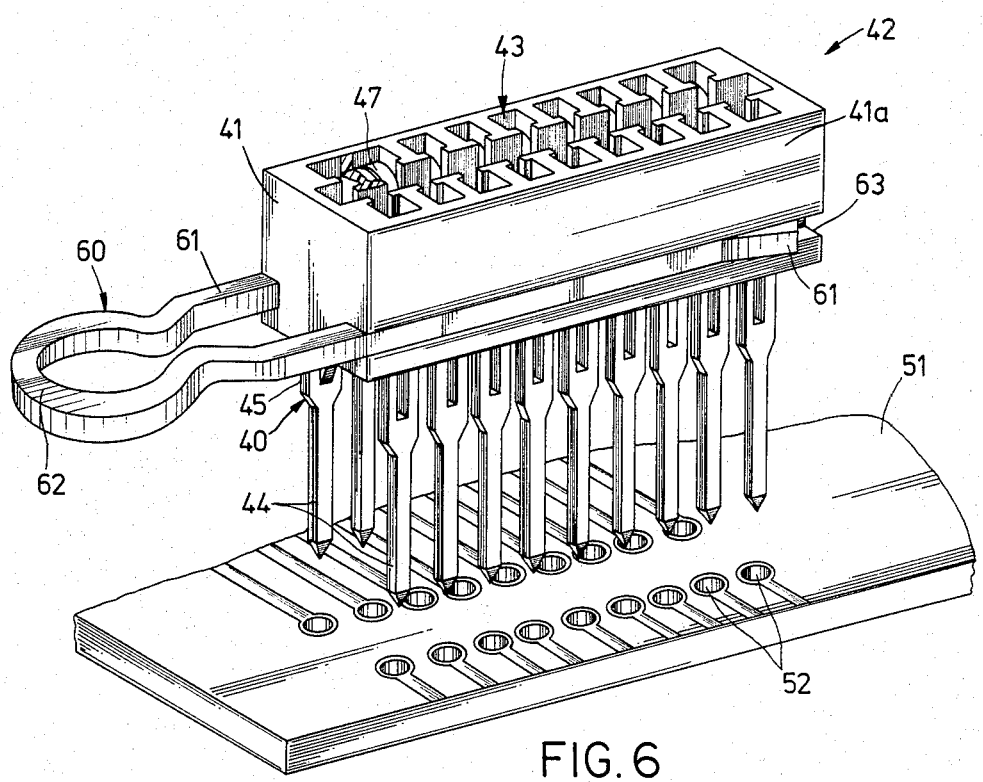
FIGS. 6 and 7 are perspective views of a connector assembly illustrating insertion of the connector terminals into corresponding apertures of a printed circuit board.

In certain applications, it is desirable to provide a plurality of terminals having the capability of forming selectively mateable electrical connections between plated apertures of a printed circuit board and a connector having circuitry leads external to the board. To this end, as illustrated in FIGS. 5 and 6, a plurality of terminals 40 may be so configured as to be received within a dielectric housing, designated generally by the reference numeral 41, in order to comprise an electrical connector, designated generally by the reference numeral 42. Suitable cavities 43 may be provided in the housing 41 to retain the terminals 40 in spaced, electrically insulated relationship.

Each terminal 4 includes a generally elongated lead portion 44, an intermediate compliant section 45, and a spring contact portion designated generally by the reference numeral 46. The spring contact portion 46 may comprise a reversely bent cantelevered spring arm 47 for providing a biased electrical connection with another circuit element such as an edge of another printed circuit board (not shown).

The compliant section 45 of terminal 40 is constructed in a manner similar to compliant section 13 of the terminal 10 shown in FIG. 1 and has a resilient finger 48 struck outwardly from a plate 49. Resilient finger 48 has a free end 50 directed oppositely of the direction in which terminal 40 is moved during insertion of the terminal 40 into a printed circuit board 51.

It can be appeciated that the use of compliant terminals 40 in housing 41 permits a plurality of terminals 40 to be inserted into the board 51, simultaneously, by use of a suitably designed arbor press or similar convenient methods. However, during assembly of the connector 42, it might be preferable to insert the terminals 40 into the housing 41 from the open end of the cavities 43, i.e. from the top as viewed in FIG. 5. In such a case, as the connector 42 is assembled to a printed circuit board by insertion of the lead portions 44 of the terminals 40 through appropriate apertures 52 of the board, the terminals 40 experience an opposing, upwardly-directed force tending to push them out of seated position in the housing 41. To prevent this withdrawal of the terminals 40 during insertion but preserve the ability to utilize the housing 41 as a force transmitting member for the terminals 40, the connector assembly 42 is provided with an insertion tool, designated generally by the reference numeral 60.

Insertion tool 60 is U-shaped and comprises a pair of rigid, generally elongated spaced apart support arms 61 extending from an integrally-formed connecting bight portion 62. Each arm 61 is receivable within a complimentary slot 63 formed in the sidewall 41a of the connector housing 41. The slot 63 is so configured as to provide access to each of the terminals 40 externally of the housing 41 such that each arm 61 of the insertion tool 60 is slidably positionable over an upwardly facing land 64 formed in each terminal 40. Cooperation of the terminal lands 64 with arms 61 of the tool 60 thereby restrains the terminals 40 against their normal upward movement, as viewed in FIGS. 5 and 6, and their withdrawal from the housing 41 during assembly of the connector to a printed circuit board 51.

Figure 7:
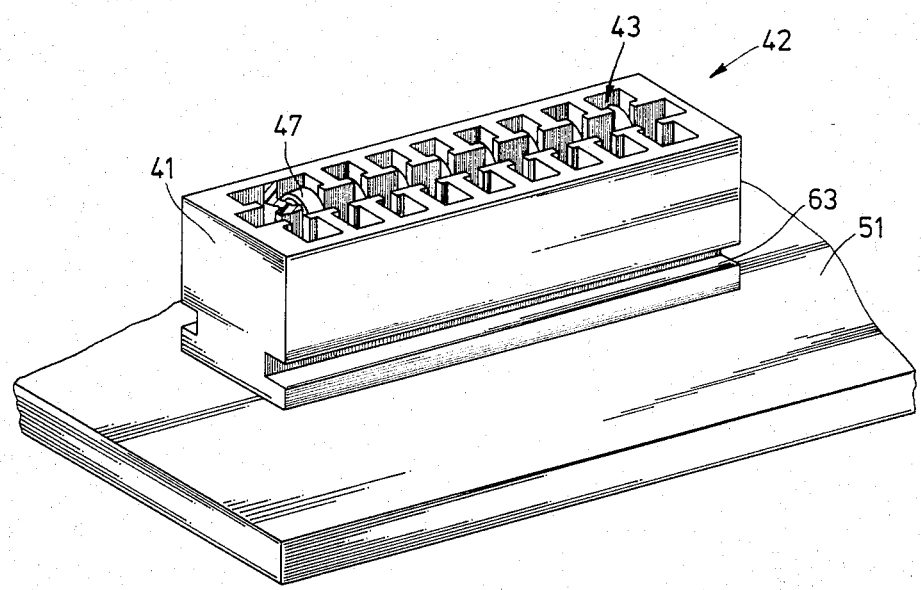

As best shown in FIGS. 6 and 7, after insertion of the connector assembly terminals 40 into apertures 52 of the printed circuit board 51, the insertion tool 60 may be manually grasped at its connecting portion 62 and slidingly disengaged from the housing slots 63. Although a manual insertion tool 60 has been illustrated, the insertion tool is equally adaptable for use with automated assembly methods. For example, the arms 61 may be connected to appropriate linkage or camming means (not shown) for automated movement into the slots 63 either laterally or longitudinal of the housing 41.

Figure 8:
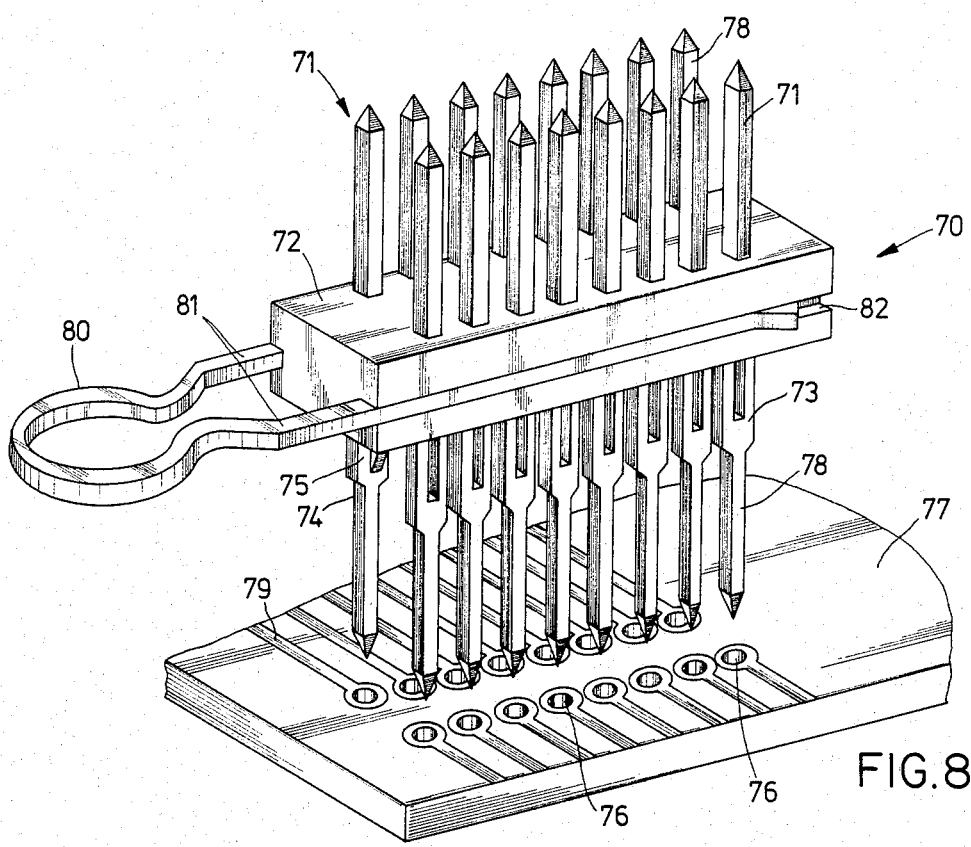
FIG. 8 is a perspective view of an alternative connector assembly in accordance with the present invention.

Turning now to FIG. 8, it can be seen that a variety of connector assemblies may be mounted on a printed circuit board in accordance with the principles of the present invention. A wafer assembly, designated generally by the reference numeral 70, may be configured to include terminals 71 extending from opposite sides of a dielectric base portion 72. The terminals 71 each have a compliant section 73 comprising a resilient finger 74 struck outwardly from a plate portion 75, which section 73 is so dimensioned as to be received with a force fit within an aperture 76 of a printed circuit board 77. Elongated contact ends 78 of the terminals 71 are thereby supported in electrical contact with circuit paths 79 of the board 77 and are available on both sides of the board 77 to make an electrical connection with suitably configured terminals of a mating female connector assembly (not shown). Terminal 71 may be formed conveniently with land portions (not shown) similar to the land portions 64 of the terminal 40 of FIG. 5, for example.

A suitable tool 80 is provided having arms 81 which are slidingly receivable in slots 82 formed in the base portion 72. In this manner, selective interengagement of the terminals 71 is facilitated, for assisting insertion of the terminals 71 into the board 77.

It should be apparent from the foregoing description that the compliant terminal of the present invention is readily maufacturable by relatively simple stamping techniques well-known in the art. Additionally, the resilient finger and plate elements of the compliant section provide for excellent mechanical and electrical connection of the terminal to a circuit board, despite variances in aperture dimensions, and permit cycling of the terminal into and out of the board aperture without damage to the aperture plating at the interface region formed with the resilient finger since, in the usual case, the terminal will be reinserted in its original orientation in the board aperture. Moreover, a plurality of terminals may be conveniently inserted into a board simultaneously using the tool and housing arrangement disclosed hereinabove.

We claim:

1. A connector assembly that is selectively mountable on a circuit board adapted with a plurality of holes with a conductive plating deposited on the interior surface of said holes, said connector assembly including
    an insulative base portion with at least one sidewall having an external surface and a plurality of terminal receiving recesses formed in said base portion, and
    a plurality of solderless, elongated electrical terminals, one mounted in each recess, each terminal having a top portion adapted to electrically contact another circuit element and a lower compliant section extending below the base portion adapted to be received in said holes in contact with said plating and allowing selective insertion and withdrawal of said terminals into and out of said holes,
    the improvement comprising:
    said terminals located adjacent said sidewall and having land portions intermediate said top portion and compliant section;
    a slot formed in the external surface of the sidewall providing external access to the recesses and the intermediate land portions mounted therein; and
    a tool having an elongated arm that is insertable from the external surface of said sidewall into the slot and extending into the recesses for simultaneous engagement with said land portions for supporting said terminals in said base portion during mounting of said assembly to said board, whereby relative movement of said terminals with respect to said housing is prevented during mounting of said connector assembly by engagement of said tool with said intermediate land portions and said side wall.

2. The connector assembly of claim 1 wherein said tool is adapted with a manually grippable end portion for selective insertion into and withdrawal from said slot means.

3. The connector assembly of claim 1 wherein said tool is generally U-shaped and comprises a pair of generally elongated arms, said arms having a generally rectangular cross section for cooperation with said land portions of said terminals.

* * * * *